United States Patent [19]
Le

[11] Patent Number: 5,652,697
[45] Date of Patent: Jul. 29, 1997

[54] COMPUTER SYSTEM BACKPLANE HAVING GROUND TABS FOR INTERCONNECTING THE BACKPLANE GROUND TO THE COMPUTER SYSTEM CHASSIS

[75] Inventor: Bao G. Le, Orange, Calif.

[73] Assignee: AST Research, Inc., Irvine, Calif.

[21] Appl. No.: 555,676

[22] Filed: Nov. 13, 1995

[51] Int. Cl.$^6$ .................................................. H01R 23/68
[52] U.S. Cl. ...................... 361/788; 361/212; 361/220; 361/799; 361/800; 174/35 R
[58] Field of Search ............................. 361/212, 220, 361/753, 788, 799, 800, 816, 683–686; 174/35 R, 35 CC, 51; 307/89, 90; 439/109, 607

[56] References Cited

U.S. PATENT DOCUMENTS

| | | | |
|---|---|---|---|
| 4,821,145 | 4/1989 | Corfits et al. | 361/800 |
| 5,023,754 | 6/1991 | Aug et al. | 361/800 |
| 5,528,464 | 6/1996 | Hamaguchi et al. | 361/796 |

Primary Examiner—Leo P. Picard
Assistant Examiner—Phuong T. Vu
Attorney, Agent, or Firm—Knobbe, Martens, Olson & Bear, LLP

[57] ABSTRACT

An improved computer chassis having a backplane with ground pads thereon for contacting fingers formed in channels in the chassis. The backplane is secured in the chassis without the use of screws. The fingers are defined within channels formed by a structure at the rear of a disk drive cage. The computer system further includes a plurality of disk drives mounted on trays which have rear pins that engage guide apertures formed in the backplane. The backplane is inserted within the channels and held therein by a pair of levers on outer corners which engage with catch members on the computer chassis. The engagement between the levers and the catch members ensures the backplane will remain in position during assembly and shipping. The backplane includes ground pads connected to a ground plane within the backplane. The ground pads engage the fingers on the channels to provide a secure electrical interconnection between the chassis and the backplane. After the backplane is inserted, the disk drives are pushed into place such that the rear pins of the trays secure the backplane in position, and such that the respective electrical connectors engage.

6 Claims, 7 Drawing Sheets

COMPUTER SYSTEM BACKPLANE HAVING GROUND TABS FOR INTERCONNECTING THE BACKPLANE GROUND TO THE COMPUTER SYSTEM CHASSIS

BACKGROUND OF THE INVENTION

1. Field of the Invention

The present invention relates to backplanes for electronic systems, and, more particularly, to an apparatus and method for grounding the backplane to the chassis of the electronic system when the backplane is inserted into the chassis.

2. Description of the Related Art

Modern computers often include multiple hard-disk drives, flexible-disk drives, CD-ROM drives, and the like. These drives include motors and mechanisms for spinning the storage media and for moving read heads or read/write heads, and also include circuitry for controlling mechanical movement as well as the transfer of data. For example, a computer system may include a RAID (Redundant Array of Inexpensive Disks) subsystem which includes three or more hard-disk drives.

In computer systems having RAID subsystems, the disk drives are mounted on separate frames or trays and inserted side-by-side into a cavity within the computer. The internal sheet metal chassis of the computer defines guides for aligning connectors on the drives with mating connectors on a rigid backplane. The backplane defines an inner wall of the cavity and provides electrical interconnections to and from the mating connectors. The backplane may be a passive backplane, or it may include electronic components which transfer data to and from the disk drives and which control the disk drives.

Typically, the backplane is constructed of an insulating rigid substrate having the electrical connections formed on one or more layers. The backplane is firmly attached to the internal chassis of the computer, typically with threaded fasteners. The cavity defined on the sides by sheet metal panels of the internal chassis and on the inner wall by the backplane, is termed the "drive cage."

Typically, a computer system having a RAID subsystem has a so-called "tower" configuration wherein the computer system is taller than it is wide, as opposed to a desktop system which is generally wider than it is tall. One aspect of a RAID subsystem is that a disk drive can be readily replaced if it fails during operation. Thus, a RAID subsystem is typically mounted in the computer system so that the disk drives can be extracted and inserted through the front of the computer system cabinet. In order to accommodate this feature, the backplane for the RAID subsystem is mounted with the backplane perpendicular to the side walls of the computer system.

In operation, the disk drives generate substantial electromagnetic interference (EMI) and radio frequency interference (RFI), and are susceptible to electrostatic discharge (ESD). It is important to provide an adequate grounding system to suppress EMI and RFI and to prevent damage from ESD. In particular, the backplane in a computer system must be securely grounded to the internal chassis. This is typically accomplished with the use of fasteners extending through apertures in the backplane and secured within threaded holes in conductive components of the chassis. The fasteners extend through apertures surrounded by conductive ground pads in the backplane. The fasteners also ensure that the backplane is rigidly attached at the inner end of the drive cage so that the various drives can be inserted and pushed against the backplane to couple the mating connectors.

The use of fasteners to attach the backplane to the computer chassis has several drawbacks. For example, positioning and engaging fasteners add complexity to the assembly process. Most of the inner components of the computer are installed through one of the large side panels. The components are designed to be installed straight in through the panel, with the locations being readily accessible. On the other hand, as discussed above, the backplane is mounted perpendicular to the plane of the side panel, and thus the fasteners extend in parallel with the side panel. This requires an assembly procedure wherein the worker has difficulty in accessing and driving the fasteners into place. Moreover, after other components are installed in the computer system, the backplane fasteners may become inaccessible without removing other components of the computer system. The inaccessibility of the fasteners increases the difficulty of maintenance. Another drawback with fastening the backplane to the drive cage is the potential for misalignment between the mating electrical connectors of the backplane and the disk drives. This comes about if the holes for the fasteners in either the backplane or the computer chassis are slightly out of alignment. In other words, to ensure that the mating connectors of the backplane and disk drives accurately align, the mounting holes in the backplane must be precisely located with respect to the backplane connectors, and the mounting holes in the chassis must be precisely located with respect to the disk drive guides. Close tolerances for these mounting holes thus ensure the accurate alignment of the connectors, which adds expense in the manufacturing process.

In view of the foregoing drawbacks, there is a need for an alternative to securing the backplane to the drive cage using fasteners.

SUMMARY OF THE INVENTION

One aspect of the present invention is an electronic system having removable electronic subsystems. The electronic system includes an enclosure and a chassis within the enclosure. The chassis is electrically connected to an electrical ground potential. The chassis has at least one channel formed therein. The channel has a plurality of resilient fingers formed therein. A backplane has first and second generally planar sides. The backplane has a plurality of electrical connectors on at least the first side to receive a plurality of removable electronic subsystems. The backplane has a ground reference plane therein. The backplane further has a plurality of ground reference pads formed on at least one of the first and second sides. The ground reference pads are positioned to engage the resilient fingers of the channel when the backplane is inserted into the channel.

Preferably, the backplane has a thickness between the first and second sides. The fingers of the channel are formed in pairs with the fingers in the pairs being spaced apart by a distance less than the thickness of the backplane such that said fingers are forced into electrical and mechanical contact with said pads when said backplane is inserted into said channel.

In particularly preferred embodiments, the backplane includes a plurality of guide holes. Each electronic subsystem has at least one guide pin formed thereon. The guide pin and the guide hole interact when the electronic subsystem is inserted into the electronic system such that the electronic subsystem is guided into electrical contact with one of the connectors on the backplane. The guide pin further interacts with the guide hole to preclude the backplane from being removed from the chassis after the electronic subsystem is inserted into the electronic system.

The electronic system described herein is a computer system, and the electronic subsystem is a disk drive.

Another aspect of the present invention is a grounding system for an electronic system. The grounding system comprises a backplane. The backplane has first and second planar sides and further has a common ground reference. A plurality of pads are formed on at least one of the first and second sides of the backplane. The pads are electrically connected to the ground reference. An electrically conductive chassis has at least one channel into which the backplane is inserted. The channel has a plurality of protrusions which electrically and mechanically engage the pads of the backplane to electrically connect the common ground reference of the backplane to the chassis.

Another aspect of the present invention is a method of grounding an electronic subsystem within an electronic system. The method comprises the steps of electrically connecting a metallic chassis to a ground reference within said electronic system and inserting a backplane into the metallic chassis. The backplane has a plurality of pads which engage a plurality of tabs on the metallic chassis. The plurality of pads are electrically connected to a ground reference on the backplane. The method includes the further step of electrically connecting the electronic subsystem to the backplane. The electronic subsystem has a ground reference which is thereby connected to the ground reference of the electronic system via the ground reference of the backplane and via the chassis.

BRIEF DESCRIPTION OF THE DRAWINGS

The preferred embodiments of the present invention will be described below in connection with the attached drawings in which.

DETAILED DESCRIPTION OF THE PREFERRED EMBODIMENTS

Figure 1:
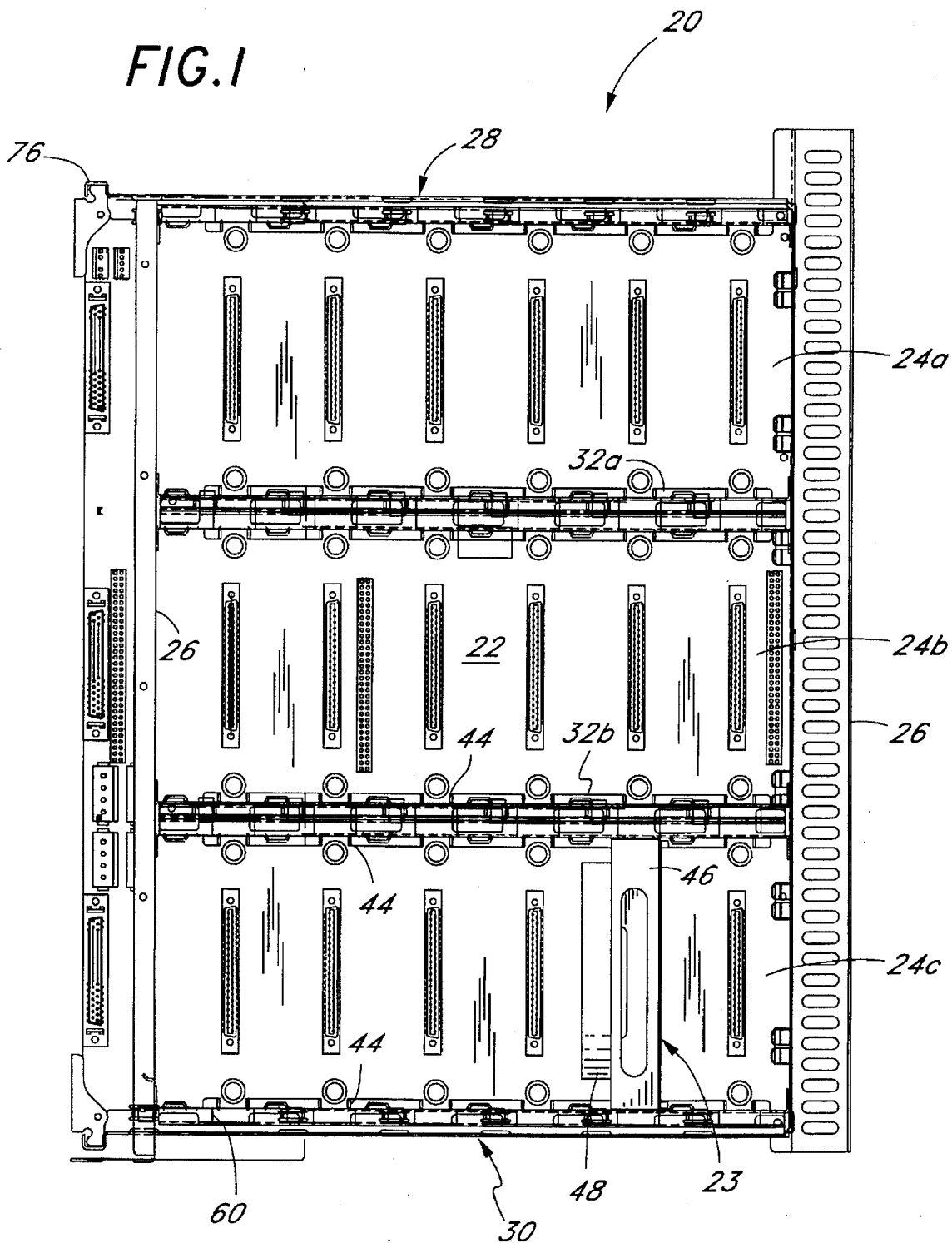
FIG. 1 is a front elevational view of a computer system incorporating an improved backplane of the present invention.

FIG. 1 is a front elevational view of a portion of a computer system 20 which incorporates an improved backplane mounting system in accordance with the present invention. The computer system 20 has a front panel removed to expose a forwardly opening disk drive cage 22 adapted to receive a plurality of computer subsystems, such as hard disk drive assemblies 23, and is preferably constructed of sheet metal in a variety of ways well known in the art. The drive cage 22 forms a portion of the inner chassis of the computer system 20. More particularly, the drive cage 22 includes three levels 24a, 24b, and 24c, each having space for six disk drives, for a total of 18 disk drives.

Figure 2:
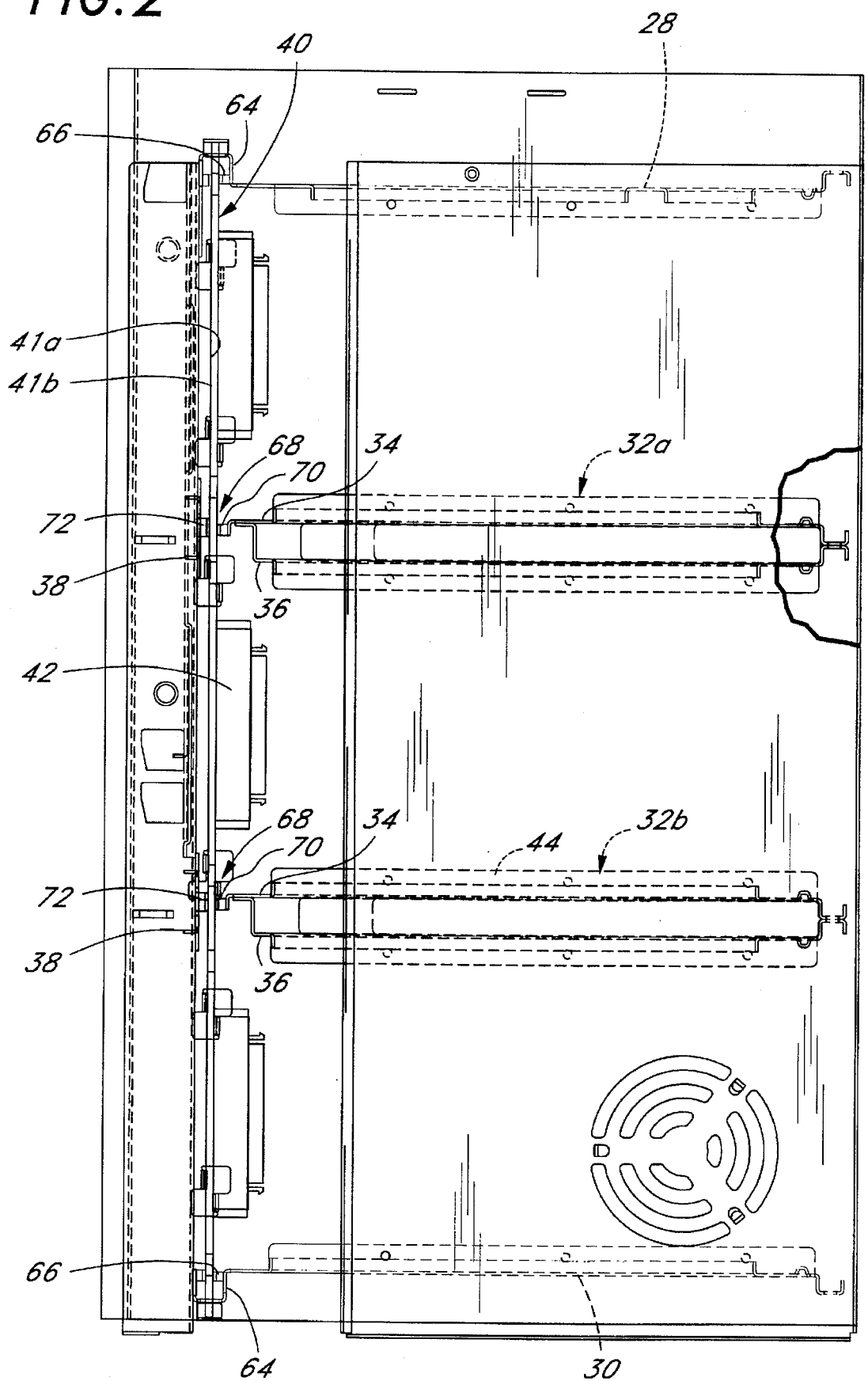
FIG. 2 is a side elevational view of the computer system of FIG. 1 with a portion of a side plate broken away.
Figure 3:
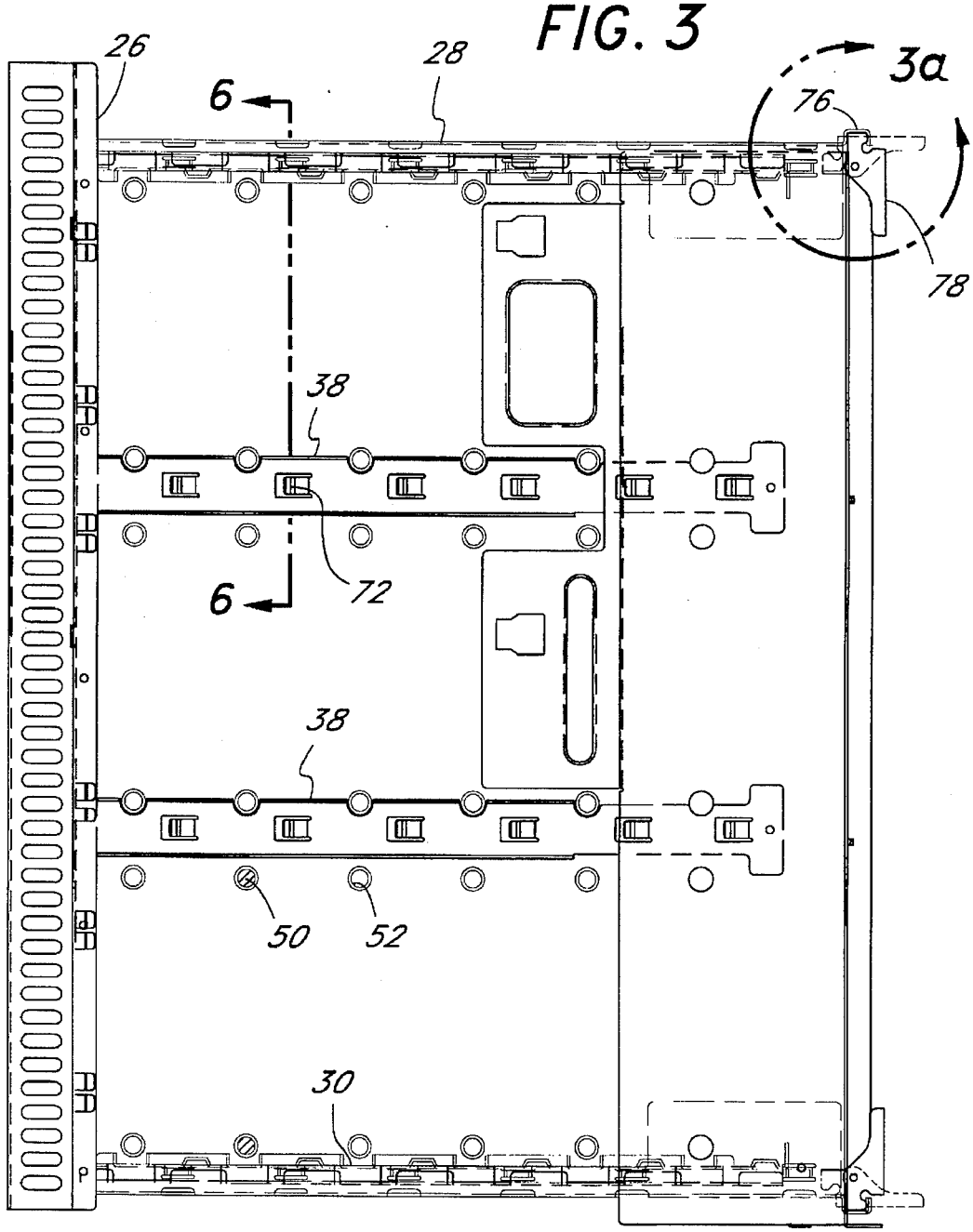
FIG. 3 is a rear elevational view of a drive cage of the computer system of FIG. 1, showing the improved backplane of the present invention installed in an internal computer chassis.

As illustrated in FIGS. 1-3, the drive cage 22 is formed by a pair of lateral side panels 26, an upper panel 28, a lower panel 30, and a pair of middle shelves 32a, 32b. The middle shelves 32a, 32b, in turn, each comprise a top half 34 and a bottom half 36. The middle shelves 32a, 32b separate the three levels 24a, 24b, 24c.

As best seen in FIGS. 2 and 3, the drive cage 22 further comprises a pair of rear panels 38 extending across the two side panels 26 at the level of the middle shelves 32a, 32b. As illustrated in the present embodiment, the rear panels 38 are relatively narrow, but it is contemplated that the rear panels may be wider in the final version to provide additional structural support as described below.

The inner wall of the drive cage 22 is defined by a large rectangular backplane 40. The backplane comprises a rigid, insulating substrate having first and second sides 41a, 41b. The substrate may have multiple layers which have a plurality of electrical interconnections formed thereon. Preferably, at least one of the layers (not shown) is a ground reference layer. Alternatively, the ground plane may be formed on one or both of the first and second sides of the backplane 40. The backplane 40 further comprises a plurality of connectors 42 for mating with associated connectors on the rear of the disk drive assemblies 23. In this regard, the drive cage 22 includes a plurality of guides 44 extending from the opening 21 directly rearwardly into the computer. The guides 44 align the various disk drive assemblies 23 with the connectors 42. The guides 44 comprise a pair of rails extending generally perpendicularly from the upper and lower panels 28, 30 and from the middle shelves 32a, 32b. A pair of guides formed by the upper and lower guides 44 are provided for each disk drive assembly 23 to enable each disk drive assembly 23 to be easily inserted into and removed from the drive cage 22.

Figure 4:
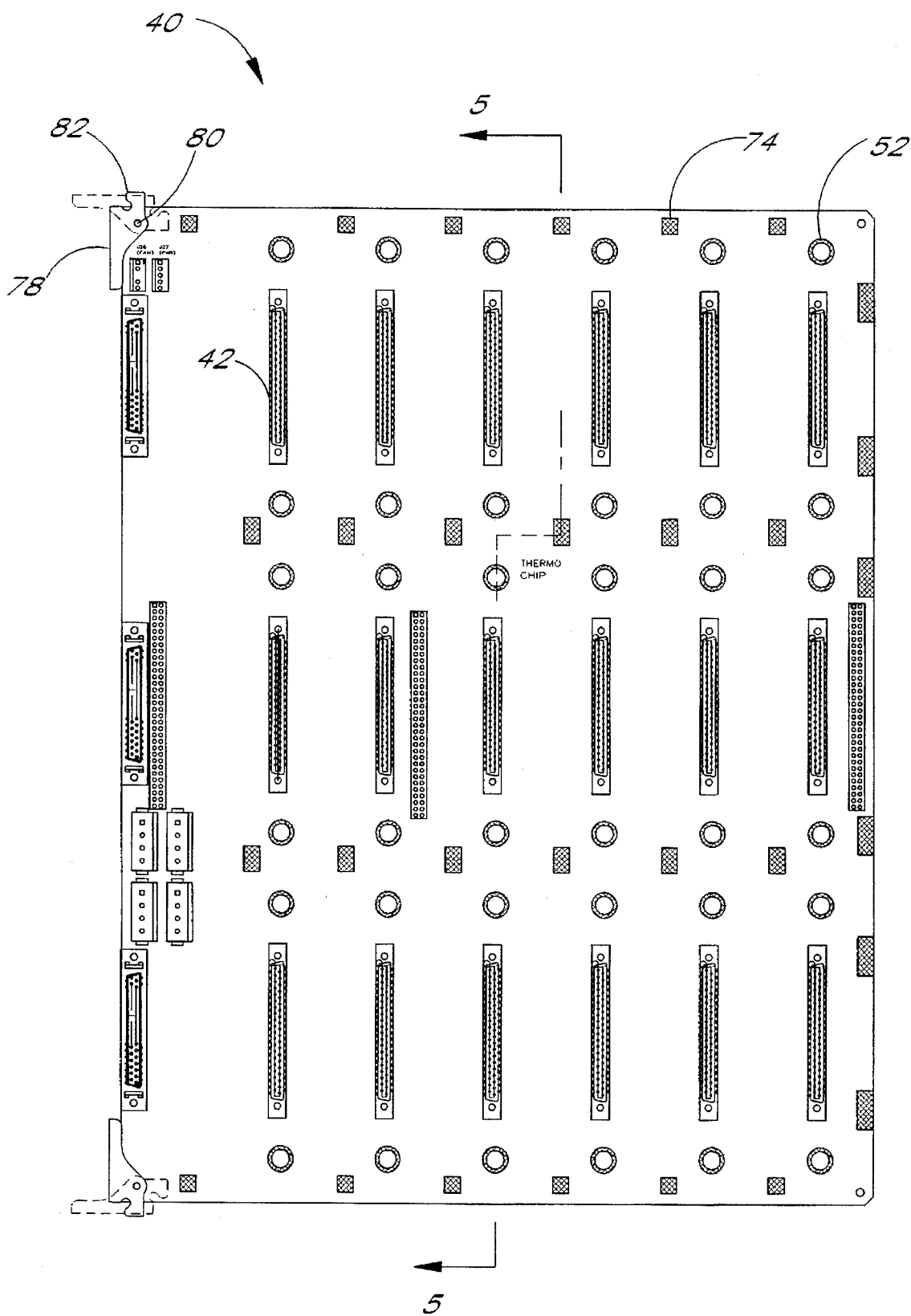
FIG. 4 is an isolated plan view of the backplane of the present invention.
Figure 5:
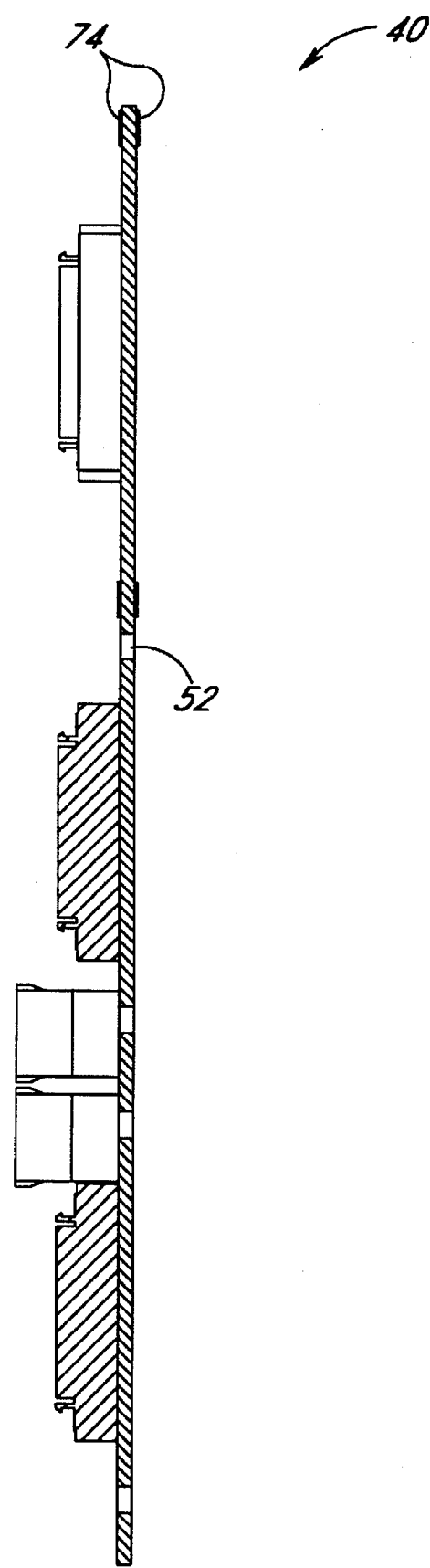
FIG. 5 is a cross-sectional view through the backplane, taken along line 5—5 of FIG. 4.
Figure 7:
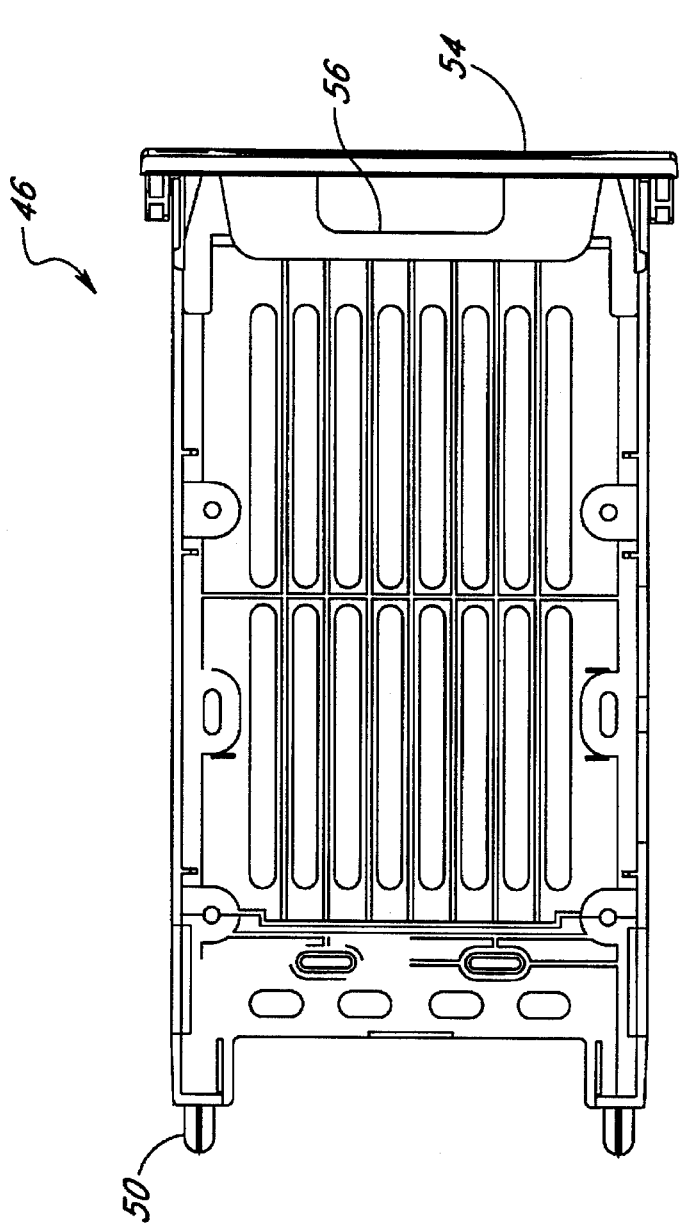
FIG. 7 is an elevational view of a disk drive tray used in conjunction with the improved backplane of the present invention.
Figure 8:
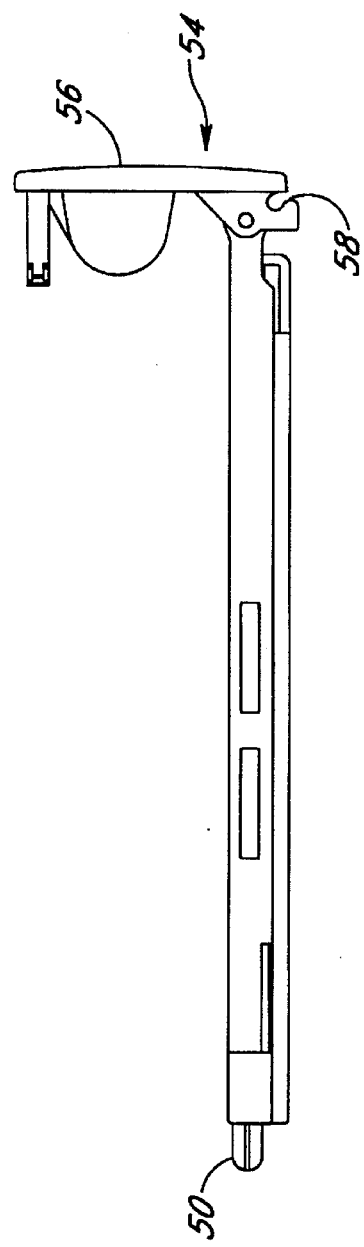
FIG. 8 is a top plan view of the disk drive tray of FIG. 7.

FIGS. 7 and 8 illustrate a tray assembly 46 on which each disk drive 48 is mounted to form each disk drive assembly 23. The tray assemblies 46 comprise a generally rectangular plastic member having a pair of rear pins 50 which are sized to extend within guide apertures 52 provided in the backplane 40. As illustrated in FIG. 4, there are thirty-six guide apertures 52 which provide two apertures 52 for each of the eighteen disk drive assemblies 23. The pins 50 extend within the apertures 52 when the mating connectors of the backplane and disk drives engage.

The tray assembly 46 further includes a pivoting bezel 54 having a handle 56 thereon. As is well known in the art, the pivoting bezel 54 includes a pair of lever latches 58 sized to extend within any two of a plurality of slots 60 formed in the front portion of the upper and lower panels 28, 30, and in the middle shelves 32a, 32b. As the disk drive assembly 23 is inserted into the drive cage 22 along the guides 44, the final travel of the disk drive assembly 23 is accomplished by pivoting the bezel 54 to cause the lever latch 58 to "pull" the disk drive assembly 23 further into the drive cage 22 so that the mating connectors 42 on the backplane 40 and on the disk drive assembly 23 engage. Likewise, to remove a disk drive assembly 23, the bezel 54 is pivoted using the handle 56 so that the lever latch 58 "pushes" the disk drive assembly 23 outward for a short distance. This prevents careless assembly or maintenance workers from damaging the disk drives assemblies 23 or the connectors 42 by pushing the disk drive assembly 23 in too fast, or by removing the disk drive assembly 23 too rapidly before the disk has stopped spinning. Pulling the disk drive out too fast while the disk is spinning could result in damage to the read/write heads or to the magnetic media.

Figure 6:
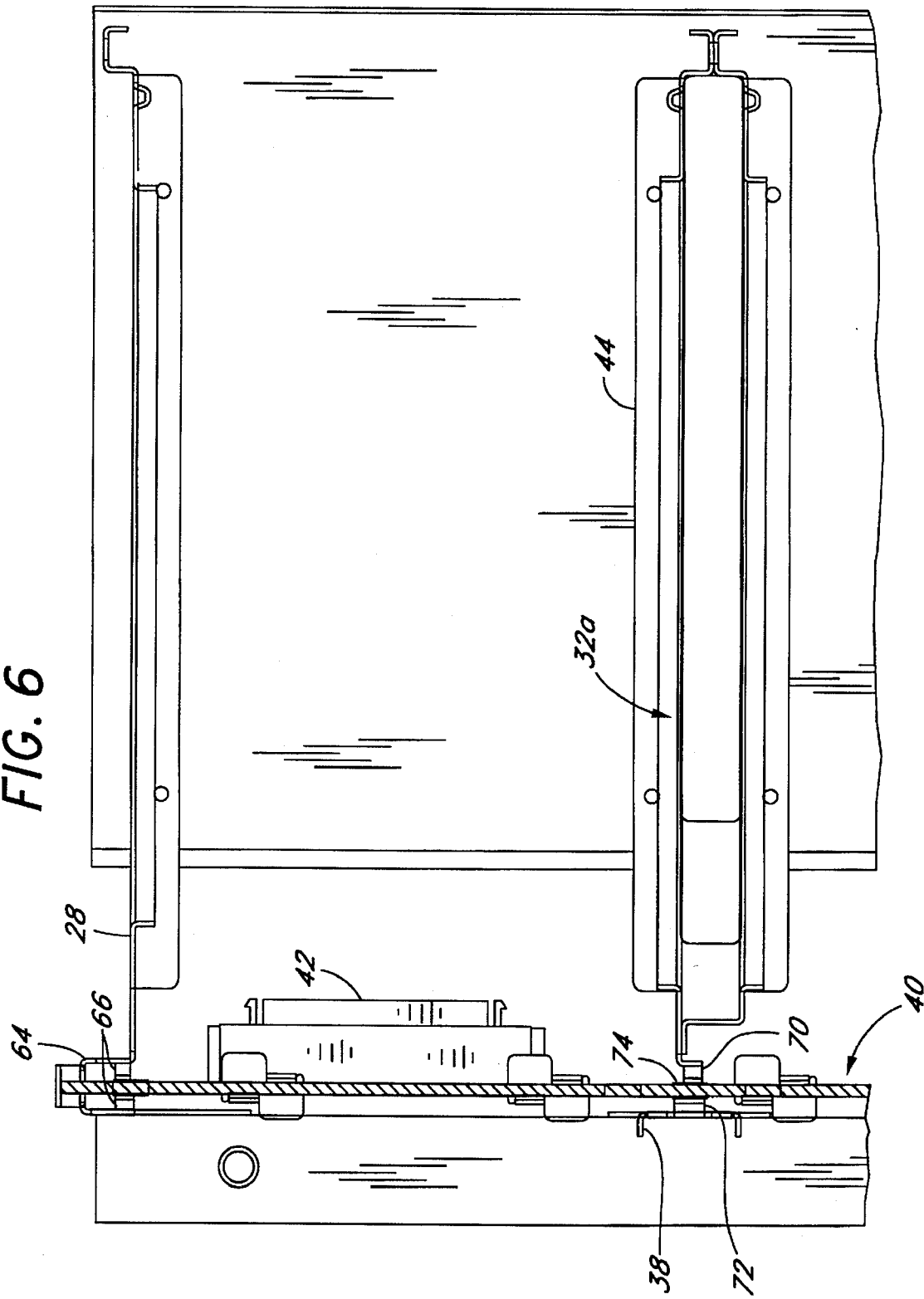
FIG. 6 is a cross-sectional view of the backplane installed in the computer system, taken along line 6—6 of FIG. 3.

As illustrated in FIGS. 2 and 6, both the top and bottom panels 28, 30 define rear channels 64 for receiving the upper and lower edges of the backplane 40, respectively. More particularly, the upper panel 28 defines a downwardly opening, generally U-shaped rear channel 64 having a series of opposed fingers 66 spaced apart a distance slightly smaller than the thickness of the backplane 40. The lower panel 30, likewise, includes an upwardly opening, generally U-shaped channel 64 having opposed fingers 66 which are also spaced apart by a distance slightly smaller than the thickness of the backplane 40. The fingers 66 are integrally formed from the sheet metal of the channel 64. In one embodiment, the fingers 66 are formed in vertically disposed transversely oriented walls in the upper and lower panels 28, 30 and comprise short lengths bent out of the plane of the vertical walls toward one another. The fingers 66 may be bent into a generally semicircular or otherwise arcuate shape having central points spaced apart by approximately 0.110 inches (2.79 mm). The backplane 50 has a thickness slightly greater than this spacing. The material may be steel or aluminum, or other suitable conducting metal, having a thickness of about 0.040 inches (1.0 mm). The fingers 66 are sufficiently resilient to spread apart when the backplane 40 is inserted therebetween and, thereafter, to aid in holding the backplane 40 in place.

Two intermediate channels 68 are defined by the middle shelves 32a, 32b and the rear panels 38. Specifically, an upper intermediate channel 68 is defined by the upper shelf 32a and the upper rear panel 38, and a lower intermediate channel 68 is defined by the lower middle shelf 32b and the lower rear panel 38. The middle shelves 32a, 32b include rearwardly extending fingers 70, each of which faces a corresponding forwardly extending finger 72 on the rear panels 38. The rearwardly extending fingers 70 and the forwardly extending fingers 72 are spaced apart a distance slightly smaller than the thickness of the backplane 40. The fingers 70, 72 are integrally formed from the sheet metal of the shelves 32a, 32b and the rear panels 38. As with the fingers 66, the fingers 70, 72 may be bent into generally semicircular or otherwise arcuate shapes having central points spaced apart by approximately 0.110 inches (2.79 mm). Thereafter, the fingers 70, 72 aid in holding the backplane 40 in place. The fingers 70, 72 are sufficiently resilient to spread apart when the backplane 40 is inserted therebetween.

The backplane 40 comprises a plurality of ground pads 74 dispersed evenly in a grid on both sides thereof. The ground pads 74 are electrically connected to an internal ground plane or layer (not shown) of the backplane 40. The internal ground plane is in turn electrically connected to ground pins on the connectors 42 to provide electrical interconnections to the disk drives 48.

The pairs of opposed fingers 66 and the pairs of fingers 70 and 72 are positioned to contact the ground pads 74 on the backplane 40 when the backplane 40 is fully inserted into the drive cage 22. In this manner, the backplane 40 is securely grounded to the internal chassis of the computer system 20 by multiple connections provided by the ground pads 74. The combination of the multiple connections and the substantial amount of metal in the drive chassis 22 provides a well-grounded system less susceptible to the EMI, RFI and ESD problems discussed above.

Figure 3A:
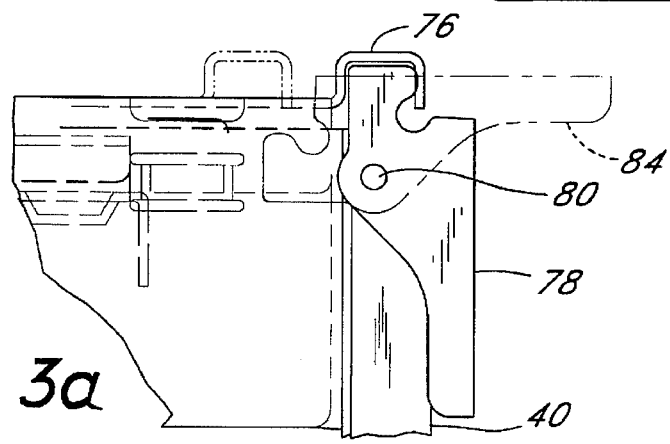
FIG. 3a is a detailed elevational view of an upper exterior corner of the backplane of FIG. 3 shown partially extending from the computer chassis.

As seen in FIG. 3, both the upper and lower panels 28, 30 include outwardly projecting catch members 76 in the plane of the backplane 40. The catch members 76 provide a rigid structure with which levers 78 on the upper and lower corners of the backplane 40 engage to assist in insertion and removal of the backplane from the channels 64 and 68. The levers 78 are rotated about pivot points 80 fixed to the backplane 40. The levers 78 include latch members 82 designed to engage with the catch members 76. More particularly, as illustrated in FIG. 3a, the backplane 40 is inserted into the channels 64 and 68 until the latch members 82 are positioned to engage the catch members 76. Each lever 78 can be rotated so that the respective latch member 82 engages the corresponding catch member 76. By pivoting the levers 78, the engagement between the latch members 82 within the catch members 76 pushes or pulls the backplane 40 to or from its fully inserted position within the channels 64 and 68. For example, as shown in solid line in FIG. 3a the lever 78 is positioned with the latch member 82 retained within the catch member 76, and the backplane 40 inserted fully within the computer chassis. In this position, the levers 78 nominally hold the backplane 40 within the computer chassis during assembly and shipping prior to insertion of any of the disk drive assemblies 23. The lever 78 is also shown in dashed line 84 after being pivoted in a counter-clockwise direction to release the latch member 82 from the catch member 76.

When the disk drive assemblies 23 are inserted into the drive cage 22 along the guides 44, the rear pins 50 mate with the guide apertures 52 to firmly hold the backplane 40 in place. In this manner, no threaded fasteners are needed to secure the backplane 40 within the computer system 20. Furthermore, previous problems with precise location of the backplane 40 with respect to the guides 44 are eliminated due to the guiding function of the rear pins 50 within the guide apertures 52. Specifically, the guide apertures 52 are accurately positioned with respect to the connectors 42. The disk drives 48 are likewise accurately located in the tray assemblies 46. Thus, when the rear pins 50 insert within the guide apertures 52, the connectors 42 are accurately located with the associated connectors on the rear of the disk drives 48.

The final step of inserting the disk drives 48 and tray assemblies 46 includes the leverage provided by the pivoting bezels 54. This leverage forces the disk drive assemblies 23 rearward into firm engagement with the backplane 40. This ensures a secure ground connection between the rear fingers of the opposed fingers 66 and corresponding ground pads 74 on the backplane 40. As discussed above, the rear panels 38 should be sufficiently rigid to resist bending when the disk drive assemblies 23 are fully inserted into engagement with the backplane 40. Thus, the rear panels 38 may be advantageously formed to have a greater width or larger cross-section than shown in the present drawings.

Although this invention has been described in terms of certain preferred embodiments, other embodiments that will be apparent to those of ordinary skill in the art are intended to be within the scope of this invention. Accordingly, the scope of the invention is intended to be defined by the claims that follow.

What is claimed is:

1. An electronic system having removable electronic subsystems, said electronic system, comprising:

an enclosure;

a chassis within said enclosure, said chassis being electrically connected to an electrical ground potential, said chassis having at least one channel formed therein, said channel having a plurality of resilient fingers formed therein; and a backplane having first and second generally planar sides, said backplane having a plurality of electrical connectors on at least said first side to receive a plurality of removable electronic subsystems, said backplane having a ground reference plane therein, said backplane further having a plurality of ground reference pads formed on at least one of said first and second sides, said ground reference pads being positioned to engage said resilient fingers of said channel when said backplane is inserted into said channel.

2. The electronic system as defined in claim 1, wherein said backplane has a thickness between said first and second sides, and wherein said fingers of said channel are formed in pairs, said fingers in said pairs being spaced apart by a distance less than said thickness of said backplane such that said fingers are forced into electrical and mechanical contact with said pads when said backplane is inserted into said channel.

3. The electronic system as defined in claim 1, wherein said backplane comprises a plurality of guide holes, and wherein each electronic subsystem has at least one guide pin formed thereon, said at least one guide pin and at least one of said guide holes interacting when said each electronic subsystem is inserted into said electronic system such that said each electronic subsystem is guided into electrical contact with one of said connectors on said backplane, said at least one guide pin further interacting with said at least one guide hole to preclude said backplane from being removed from said chassis after said each electronic subsystem is inserted into said electronic system.

4. The electronic system as defined in claim 3, wherein said electronic subsystem is a disk drive.

5. A grounding system for an electronic system, said grounding system comprising:

a backplane, said backplane having first and second planar sides, said backplane further having a common ground reference;

a plurality of pads formed on at least one of said first and second sides of said backplane, said pads electrically connected to said ground reference; and an electrically conductive chassis, said chassis including at least one channel into which said backplane is inserted, said channel having a plurality of protrusions, said protrusions electrically and mechanically engaging said pads of said backplane to electrically connect said common ground reference of said backplane to said chassis.

6. A method of grounding an electronic subsystem within an electronic system, said method comprising the steps of:

electrically connecting a metallic chassis to a ground reference within said electronic system;

inserting a backplane into said metallic chassis, said backplane having a plurality of pads which engage a plurality of tabs on said metallic chassis, said plurality of pads electrically connected to a ground reference on said backplane; and electrically connecting said electronic subsystem to said backplane, said electronic subsystem having a ground reference which is thereby connected to said ground reference of said electronic system via said ground reference of said backplane and via said chassis.

* * * * *